United States Patent [19]

Leibenzeder et al.

[11] Patent Number: 4,606,780
[45] Date of Patent: Aug. 19, 1986

[54] METHOD FOR THE MANUFACTURE OF $A_3B_5$ LIGHT-EMITTING DIODES

[75] Inventors: Siegfried Leibenzeder, Erlangen; Christine Heindl, Mantel, both of Fed. Rep. of Germany

[73] Assignee: Siemens Aktiengesellschaft, Munich, Fed. Rep. of Germany

[21] Appl. No.: 664,148

[22] Filed: Oct. 24, 1984

[30] Foreign Application Priority Data

Oct. 28, 1983 [DE] Fed. Rep. of Germany ....... 3339272

[51] Int. Cl.$^4$ .......................................... H01L 21/208
[52] U.S. Cl. .................................... 148/171; 148/172; 148/173; 29/569 L
[58] Field of Search .............. 29/569 L; 148/171, 172, 148/173

[56] References Cited

U.S. PATENT DOCUMENTS

| 3,537,029 | 10/1970 | Kressel et al. | 148/171 X |
| 4,386,975 | 6/1983 | Leibenzeder et al. | 29/569 L |
| 4,427,841 | 1/1984 | Rahilly | 148/171 X |
| 4,507,157 | 3/1985 | Oliver | 29/569 L |
| 4,540,451 | 9/1985 | Leibenzeder et al. | 148/173 |

Primary Examiner—George T. Ozaki
Attorney, Agent, or Firm—Kenyon & Kenyon

[57] ABSTRACT

A method for the manufacture of $A_3B_5$ light-emitting diodes, particularly of light-emitting (Ga,Al)As diodes with Te and Zn as doping materials is provided. A first n-doped GaAlAs layer is epitaxially applied on a GaAs substrate from an n-doped (S,Se,Te) Ga,Al,As melt and after an interim precipitation without contact with the GaAs substrate, preferably on an auxiliary substrate, a GaAlAs layer p-doped with Zn or Mg is deposited on the substrate already epitaxially coated with the n-GaAlAs layer. Efficient light-emitting diodes are obtained.

7 Claims, 3 Drawing Figures

"

METHOD FOR THE MANUFACTURE OF $A_3B_5$ LIGHT-EMITTING DIODES

BACKGROUND OF THE INVENTION

This invention relates to a method for the manufacture of $A_3B_5$ light-emitting diodes (LEDs), especially (Ga,Al)As light-emitting diodes with Te and Zn as doping materials by precipitation of (Ga,Al)As from n- and p-doped Ga,Al,As melts via liquid-phase epitaxy.

Light-emitting diodes are semiconductor diodes with a pn junction which, upon application of a voltage in the forward direction at the pn junction and in its immediate vicinity emit nondirectional incoherent electromagnetic radiation in the infra-red, visible or ultra-violet spectral ranges. As semiconductor material for these light-emitting diodes, III–V compounds are particularly suitable. Light-emitting diodes are suitable for a wide variety of optoelectronic applications. For instance, by means of LEDs electrical energy can be converted into light energy and can thereby be transmitted optically. The light output of light-emitting diodes should be as high as possible.

It is known to precipitate on a GaAs substrate by heteroepitaxy methods, in which two mixed-crystal layers with different Al content and conduction type from two Ga,Al,As melts are deposited in two separate epitaxy steps on a GaAs substrate (See, IEEE Transactions on Electron Devices, Vol. Ed-28, No. 4, April 1981). The several operations required for epitaxy for heterostructures of relatively complicated designs, require several Al-containing Ga- melts and a relatively large amount of technical and technological means. Furthermore, relatively thick Ga,Al,As melts are required to ensure a constant Al content in the mixed-crystal layer with a thickness of, for instance, 20 μm to 30 μm.

A method is also known in which the Al content decreases continuously with increasing layer growth. This method is known by the name "Graded-band-gap method" and is described, for instance, in "Journal of Applied Physics", vol. 48, No. 6, June 1977. The incorporation close to the edge of the band, which is present, for instance, with Te, causes high absorption losses of the light produced at the pn junction, together with low light yield.

SUMMARY OF THE INVENTION

It is therefore an object of the invention to develop a method for manufacturing light-emitting diodes (LEDs) with high efficiency, for the visible spectral range, with a peak emission wavelength of 620 nm to 700 nm on the basis of (Ga,Al)As. By means of liquid-phase epitaxy (LPE), light-active $Ga_{1-x}Al_xAs$ layers are to be deposited on GaAs substrates.

According to this invention, this object is met by the provision that a first n-GaAlAs layer is epitaxially applied on a GaAs substrate, from a Ga,Al,As melt n-doped with S, Se, or Te and, after an interim precipitation without contact with the GaAs substrate, is epitaxially applied on the substrate with the n-GaAlAs layer, which is p-doped with Zn or Mg. In this manner light-emitting diodes with high efficiency can be obtained. An auxiliary substrate has been found particularly advantageous for the interim precipitation.

According to the invention, the (Ga,Al)As precipitation with a graded bandgap is accomplished from an S, Se or Te-doped Ga,Al,As melt where the p-(Ga,Al)As layer grows by a doping change of the Ga,Al,As melt with Zn or Mg via the gaseous phase on the first-precipitated and doped (Ga,Al)As epitaxial layer, and thereby, the pn-junction is formed.

The method according to the present invention will be referred to in the following discussion as the "step-grading method".

For preventing absorption losses due to the incorporation of the S, Se or Te near the edge of the band, it is advantageous to keep the graded bandgap sufficiently steep at least in the vicinity of the pn-junction. This steepness of the graded bandgap can be accomplished via a higher Al-content of the Ga,Al,As melt and/or by a higher cooling rate, preferably by a cooling rate of 0.5 to 5 degrees K/min of the melt.

By the step-grading method according to the invention, an abrupt change of the Al-concentration between the n- and p-(Ga,Al)As layer, (i.e., in the vicinity of the pn-junction) can be achieved, whereby an increase of the electron injection from the n-layer into the more efficient p-region is obtained. The radiation intensity of the diodes is thereby increased.

Although an abrupt change can also be realized in heteroepitaxial processes via the different Al content of two melts, the higher cost of these processes is a disadvantage. According to the present invention, on the other hand, only one Ga,Al,As melt is necessary for the abrupt change of the mixed crystal composition between the n- and p- layer.

In contrast to heterostructures where the mixed crystal composition in the respective epitaxial layer is constant, the Al-content increases in the method according to the invention particularly in the n-layer in the direction of the radiation, which results in a better light output.

The light-emitting diodes obtained by the method according to the invention are particularly suited for use in visible spectral range applications such as indicator lights, seven-segment displays or alphanumeric displays in telephone, data and signal systems and equipment and in consumer electronics.

DETAILED DESCRIPTION OF THE INVENTION

Further details of the invention will be explained by reference to the embodiment example shown in FIG. 1 and explained in FIGS. 2 and 3.

Figure 1:
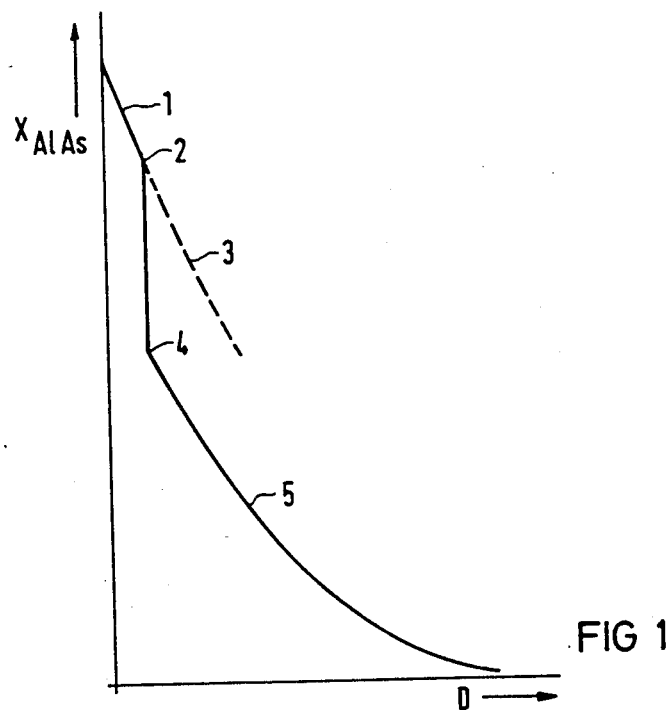

From FIG. 1, the growth of the n-(Ga,Al)As layer 1 can be seen. After the growth of the n-(Ga,Al)As layer 1, the thickness of which is determined by the time of the melt separation from the main substrate at point 2, where the time and accordingly the layer thickness and the emission wavelength are variable, the further layer precipitation takes place on an auxiliary substrate 3 with decreasing Al-content of the mixed crystal. During 3, the Zn is evaporated and the main substrate is brought into contact again at point 4 with the now Al-depleted Ga,Al,As melt. The place change of the melts and substrates can be accomplished by means of a slider rotator boat. In the vicinity of the abrupt band change, the pn-junction is therefore formed and the Zn-doped (Ga,Al)As layer grows in region 5.

Figure 2:
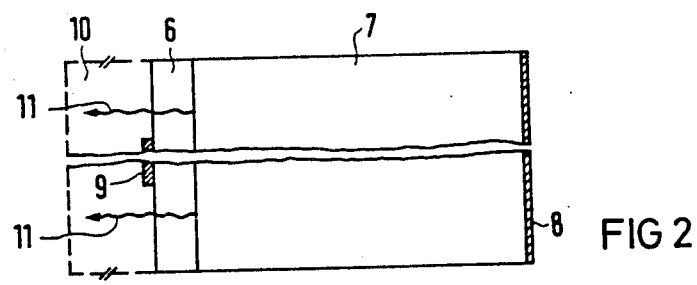

FIG. 2 shows an n-conducting layer 6, a p-conducting layer (Ga,Al)As layer 7, a p-contact 8, an n-contact 9, and a GaAs substrate 10. The GaAs substrate 10 is removed after the epitaxial process in order to improve the light output. The photons 11 generated at the pn-junction by radiating recombination can then emerge almost without absorption losses through the n-layer 6, the Al-content of which increases in the radiation direction.

Figure 3:
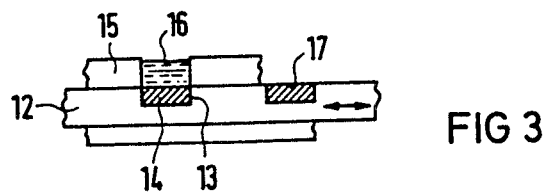

FIG. 3 shows a device for carrying out the invention.

In the embodiment example, the invention will be explained in greater detail, making reference to FIGS. 1 to 3.

The epitaxial process is carried out in a horizontally arranged graphite slider boat of known design.

In the boat slider 12 there is a depression 13 for receiving the GaAs substrate 14. The boat box 15 is designed with a chamber 16 which serves for receiving the Al-containing Ga,As melt. The atomic fraction $x^1_{Al}$ of the melt is 4 to $10 \times 10^{-3}$. The boat is located in a quartz tube through which $H_2$ flows and is heated up to the epitaxy temperature of about 1193° K., but temperatures of from about 1173 to about 1273 degrees K. is the preferred range.

After the thermodynamic equilibrium is established, the GaAs substrate is brought into contact with the Te-doped Ga,Al,As melt, and the furnace is cooled down while layer growth comes about. After the growth of the Te-doped (Ga,Al)As layer 1, the melt is separated from the GaAs substrate at the time 2. The further precipitation can take place in the melt or on an auxiliary substrate 17.

During the time 3 in which the precipitation takes place in the melt or on the auxiliary substrate, Zn is evaporated which is located at the gas inlet of the quartz tube which is heated separately. Thereby, the n-doped Ga,Al, As-melt is compensated and finally p-doped.

At point 4, the substrate is brought into contact again with the Ga,Al,As melt which is now Al-depleted, in the process of which the p-layer is deposited by further cooling. Thereby, the position of the pn-junction is fixed in the region of the abrupt band transition.

By the time of the melt separation from the substrate at point 2, the n-layer thickness, and because of the Al-content of the Ga,As-melt, the emission wavelength is variable with advancing growth.

I claim:

1. A method for manufacturing (Ga,Al)As light-emitting diodes, by precipitation of (Ga,Al)As from n- and p-doped Ga,Al,As melts via liquid-phase epitaxy, comprising epitaxially applying a first n-GaAlAs layer, on a GaAs substrate, a Ga,Al,As melt n-doped with S, Se or Te, and after an interim precipitation without contact with the GaAs substrate, a GaAlAs layer epitaxially applying p-doped with Zn or Mg on the substrate epitaxially treated with the n-GaAlAs layer.

2. A method according to claim 1, wherein the precipitation is performed from a Ga,Al,As melt with a steep graded bandgap.

3. A method according to claim 2, wherein the steep course of the graded bandgap is achieved by an atomic fraction of Al in the starting melt in the vicinity of about 4 to $10 \times 10^{-3}$.

4. A method according to claim 2, wherein the steep course of the graded bandgap is achieved by a higher cooling rate in the range of about 0.5 to about 5 degrees K./ of the melt.

5. A method according to claims 1, 2, 3 or 4 wherein saturation of Ga with As takes place at a temperature of 1173° to 1273° C.

6. A method according to claim 5 wherein the interim precipitation takes place on an auxiliary substrate.

7. A method according to claims 1, 2, 3 or 4 wherein the interim precipitation takes place on an auxiliary substrate.

* * * * *